US006579609B1

(12) United States Patent
Talibuddin

(10) Patent No.: US 6,579,609 B1
(45) Date of Patent: Jun. 17, 2003

(54) METALLIZED POLYESTER COMPOSITION

(75) Inventor: Sapna Halim Talibuddin, Mt. Vernon, IN (US)

(73) Assignee: General Electric Company, Pittsfield, MA (US)

( * ) Notice: Subject to any disclaimer, the term of this patent is extended or adjusted under 35 U.S.C. 154(b) by 0 days.

(21) Appl. No.: 09/708,928

(22) Filed: Nov. 8, 2000

(51) Int. Cl.[7] .................... B32B 15/04; B32B 15/06; B32B 27/18; B32B 27/20; B32B 27/36
(52) U.S. Cl. .................. 428/323; 428/457; 428/458; 428/480; 264/330; 427/250; 427/419.1
(58) Field of Search ................. 428/480, 457, 428/458, 324, 323; 427/294, 296, 585, 248.1, 550, 250, 419.1; 264/330

(56) References Cited

U.S. PATENT DOCUMENTS

| 2,465,319 A | | 3/1949 | Rex et al. | |
|---|---|---|---|---|
| 3,047,539 A | | 7/1962 | Pengilly | |
| 3,953,394 A | | 4/1976 | Fox et al. | |
| 4,351,758 A | | 9/1982 | Lu et al. | |
| 4,440,801 A | * | 4/1984 | Aviram et al. | 427/306 |
| 4,524,191 A | * | 6/1985 | Nakamura et al. | 524/438 |
| 4,536,531 A | * | 8/1985 | Ogawa et al. | 524/133 |
| 4,664,983 A | * | 5/1987 | Nakamura et al. | 427/307 |
| 4,699,942 A | * | 10/1987 | Weaver et al. | 524/100 |
| 4,795,771 A | * | 1/1989 | Yoshihara | 524/114 |
| 4,880,860 A | * | 11/1989 | Blocker | 523/351 |
| 5,086,104 A | * | 2/1992 | Wada et al. | 524/217 |
| 5,149,734 A | | 9/1992 | Fisher et al. | |
| 5,221,704 A | * | 6/1993 | Shimotsuma et al. | 524/114 |
| 6,074,740 A | * | 6/2000 | Scheckenbach et al. | 204/192.14 |
| 6,160,085 A | * | 12/2000 | Fujimori et al. | 528/271 |

FOREIGN PATENT DOCUMENTS

JP   11241006   7/1999

* cited by examiner

Primary Examiner—Vivian Chen

(57) ABSTRACT

A molded resin article consisting essentially of about 80 to about 99.9 weight percent of a crystallizable polyester, about 0.1 to 10% by weight of one or more nucleating agents, and less than about 5% by weight additional ingredients, wherein the molded resin article has a heat deflection temperature of at least 160° C.

14 Claims, No Drawings

METALLIZED POLYESTER COMPOSITION

FIELD OF THE INVENTION

This invention relates to a metallized polyester molded article for use in automotive headlamp housings, such as bezels and reflectors.

BACKGROUND OF THE INVENTION

Direct metallization of automotive headlamp housings, such as bezels and reflectors, is preferred by automotive manufacturers since it significantly reduces production cost. Flawless surface appearance is a critical requirement for direct metallization since even small surface defects are considerably enhanced after metallization. In addition, with the advent of hotter lamps and new styling technologies, high heat resistance is becoming increasingly important. For instance, headlamp bezels were formerly molded using materials with a heat deflection temperature of 150° C. but now require heat stability at temperatures above 160° C.

U.S. Pat. No. 3,953,394 to Fox describes alloys of poly (butylene terephthalate) [PBT] and poly(ethylene) terephthalate [PET] containing 1–80% by weight of glass or mineral filler. U.S. Pat. No. 4,351,758 to Lu et al. describe PBT and PET mixtures containing 4–65 weight percent of reinforcing agent including mineral fillers and 0.1–20 weight percent of a nucleating agent such as an alkali metal salt with anions that are oxides of elements from Group IV of the Periodic Table, talc and barium sulfate that yield smooth, glossy surfaces and high heat deflection temperatures when molded at temperatures below 110° C. U.S. Pat. No. 5,149,734 to Fisher et al. describe compositions consisting essentially of PBT, PET and 50–75 weight percent of barium sulfate filler of particle size ranging from 0.05 to 50 micron for smooth, glossy surface appearance.

Polyester compositions containing various ingredients including a high level of reinforcing agents can provide the heat resistance required. However, the inclusion of fillers can be detrimental to achieving a smooth surface. Excellent dispersion of filler is very critical to obtaining a smooth, flawless surface. Moreover, the use of high filler levels significantly increases the specific gravity of the composition, thereby elevating the cost per unit volume of the product. Hence, it is desirable to provide resins with high heat resistance and low specific gravity without detracting from desirable surface properties that contribute to good appearance and ease of metallization.

SUMMARY OF THE INVENTION

This invention relates to a metallized polyester article where the resin has low levels of nucleating agent and a heat deflection temperature (HDT) greater than 160° C. The molded resin composition provides an excellent surface for direct metallization. According to a preferred process for molding the resin, the mold temperature is greater than about 70 degrees Centigrade to obtain a HDT greater than about 160° C.

A metallized molded resin article, based on the weight of the total resin a composition, consists essentially of from about 80 to about 99.9 weight percent, preferably about 90 to about 99.9 weight percent of a polyester crystallizable resin derived from aliphatic or cycloaliphatic diols, or mixtures thereof, containing 2 to 10 carbon atoms and at least one aromatic dicarboxylic acid wherein the aromatic group is a $C_6$ to $C_{20}$ aryl radical; wherein the remaining amount consists essentially of a nucleating agent and compatible additional ingredients. The preferred amount of nucleating agent is from about 0.1 to about 10 percent by weight, with the most preferred level being about 0.1 to about 1 percent by weight based on the total weight of the resin component of the article. The metallization is carried out under a vacuum using techniques known in the art. Preferably the metal used is aluminum, particularly for a vehicle lamp.

DESCRIPTION OF THE PREFERRED EMBODIMENTS

The polyester component includes crystallizable resins derived from aliphatic or cycloaliphatic diols, or mixtures thereof, containing 2 to 10 carbon atoms and at least one aromatic dicarboxylic acid wherein the aromatic group is a $C_6$ to $C_{20}$ aryl radical. The polyester is preferably a poly (alkylene terephthalate) and is most preferably poly (butylene terephthalate).

Preferred nucleating agents can be compounds that are oxides, sulfates, silicates, stearates, or benzoates of elements from Group I, II, and IV of the Periodic Table, and mixtures thereof. The most preferred nucleating agent is talc or barium sulfate with talc being preferred over barium sulfate. The level of the nucleating agent in the polymer mixture is 0.1–20 weight percent of the composition, with the preferred level being 0.1 to 10 and the most preferred level being 0.1 to 1 weight percent of the total composition. The average particle size of the nucleating agent should range from 0.1 to 20 micron, with the preferable average particle size being within 0.1 to 10 micron and the most preferred average particle size being within 0.1 to 1 micron. Preferred compositions of the resin component consist essentially of 96, preferably 98 percent by weight polyester based on the weight percent of the resin component.

The composition of the present invention may include additional components, such as a compatible mold release agent, which do not interfere with the previously mentioned desirable properties. Any additional ingredients, other than the polyester and nucleating agent, are desirably present in an amount less than about 5%, preferably less than about 2%, more preferably less than about 1% by weight based on the total weight of the resin.

Preferred crystalline thermoplastic polyesters are polyesters derived from an aliphatic or cycloaliphatic diol, or mixtures thereof, containing from 2 to about 10 carbon atoms and at least one aromatic dicarboxylic acid. Preferred polyesters are derived from an aliphatic diol and an aromatic dicarboxylic acid having repeating units of the following general formula:

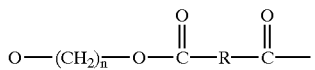

wherein n is an integer of from 2 to 6. R is a C6–C20 aryl radical comprising a decarboxylated residue derived from an aromatic dicarboxylic acid.

Examples of aromatic dicarboxcylic acids represented by the decarboxylated residue R are isophthalic or terephthalic acid, 1,2-di(p-carboxyphenyl)ethane, 4,4'-dicarboxydiphenyl ether, 4,4' bisbenzoic acid and mixtures thereof. All of these acids contain at least one aromatic nucleus. Acids containing fused rings can also be present, such as in 1,4- 1,5- or 2,6-naphthalene dicarboxylic acids. The preferred dicarboxylic acids are terephthalic acid, isophthalic acid, naphthalene dicarboxylic acid or mixtures thereof.

Typical polyesters are poly(ethylene terephthalate) ("PET"), and poly(1,4-butylene terephthalate), ("PBT"), poly(ethylene naphthanoate) ("PEN"), poly(butylene naphthanoate), ("PBN"), (polypropylene terephthalate) ("PPT") and poly(cyclohexanedimethanol terephthalate) ("PCT").

Also contemplated herein are the above polyesters with minor amounts, e.g., from about 0.5 to about 5 percent by weight, of units derived from aliphatic acid and/or aliphatic polyols to form copolyesters. The aliphatic polyols include glycols, such as poly(ethylene glycol). Such polyesters can be made following the teachings of, for example, U.S. Pat. Nos. 2,465,319 and 3,047,539.

The preferred poly(1,4-butylene terephthalate) resin used in this invention is obtained by polymerizing a glycol component at least 70 mol %, preferably at least 80 mol %, of which consists of tetramethylene glycol and an acid component at least 70 mol %, preferably at least 80 mol %, of which consists of terephthalic acid, or polyester-forming derivatives thereof.

The polyesters used herein have an intrinsic viscosity of from about 0.4 to about 2.0 dl/g as measured in a 60:40 phenol/ tetrachloroethane mixture or similar solvent at 23–30° C.

The preferred polyester of the invention will be crystalline polyesters in having a melting point from 150 to 300° C. with the most preferred polyester melting between 180 and 250° C.

The resin mixture may typically comprise additional ingredients which may be added to contribute to desirable properties previously mentioned which include good mechanical properties, color stability, oxidation resistance, good flame retardancy, good processability, i.e. short molding cycle times, good flow and easy release from a mold, and good metallization properties.

The method of blending the compositions can be carried out by conventional techniques. One convenient method comprises blending the polyester and nucleating agent, and other ingredients in powder or granular form, extruding the blend under temperature sufficient to melt the polyester and comminuting into pellets or other suitable shapes. The ingredients are combined in any usual manner, e.g., by dry mixing or by mixing in the melted state in an extruder, in a heated mill or in other mixers.

Although it is not essential, best results are obtained if the ingredients are pre-compounded, pelletized and then molded. Pre-compounding can be carried out in conventional equipment. For example the polyester resin and other additives can be added to the throat of a single screw extruder having a mixing screw with a long transition section to ensure proper melting. On the other hand, a twin screw extrusion machine can be fed with resins and additives at the feed port at the throat or down stream. Other compounding variations are within the scope of this invention.

The pre-compounded composition can be extruded and cut or chopped into molding compounds, such as conventional granules, pellets, etc. by standard techniques. According to preferred process for increasing the HDT of the molded resin to greater than 1 60° C., the resin is injected into a mold having a mold temperature greater than 70° C. to obtain the preferred higher heat.

EXAMPLES 1–6

The components of the formulations presented in Table 1 were tumbled blended and then extruded on a 30 mm 29:1 L/D twin-screw extruder equipped with a vacuum vent. A processing profile of 250–260° C. from feed-zone to die-head was employed. The compositions were dried at 120–125° C. for 4 hours and then injection molded into 3.2 mm thick flame bars on an 85 ton Van Dorn molding machine with a barrel set temperature of 260–270° C., 77° C. mold temperature, 12 s injection time, 14–18 s hold time and 0.7 MPa back pressure. In addition, smooth 15 cm×10 cm×3.2 mm plaques were molded from Comparative example A and Examples 1–3 under the molding conditions described above and directly metallized with aluminum using a vacuum deposition process.

TABLE 1

| Example | A* | 1 | 2 | 3 | 4 | 5 | 6 |
|---|---|---|---|---|---|---|---|
| Polyester[a] | 99.7 | 99.4 | 94.7 | 94.4 | | | |
| Polyester[b] | | | | | 96.5 | | |
| Polyester[c] | | | | | | 96.5 | |
| Polyester[d] | | | | | | | 96.5 |
| Titanium dioxide | | | 5 | 5 | 3 | 3 | 3 |
| Talc | | 0.3 | | 0.3 | 0.2 | 0.2 | 0.2 |
| Phosphite Stabilizer | 0.1 | 0.1 | 0.1 | 0.1 | 0.1 | 0.1 | 0.1 |
| Pentaerythritol tetrastearate | 0.2 | 0.2 | 0.2 | 0.2 | 0.2 | 0.2 | 0.2 |
| Total | 100 | 100 | 100 | 100 | 1001 | 100 | 100 |

[a] = Poly(1,4-butylene terephthalate), "VALOX", 5000 poise General Electric Company
[b] = Poly(1,4-butylene terephthalate), "VALOX", 3000 poise General Electric Company
[c] = Poly(1,4-butylene terephthalate), "VALOX", 4500 poise General Electric Company
[d] = Poly(1,4-butylene terephthalate), "VALOX", 7000 poise General Electric Company
* = Comparative Example

EXAMPLE 7

The components of the formulation presented in Table 2 were extruded on a 40 mm 41:1 L/D twin-screw extruder equipped with a vacuum vent. A processing profile of 250–260° C. from feed-zone to die-head was employed. The composition was dried at 120–125° C. for 4 hours and then injection molded into 3.2 mm thick flame bars on an 85 ton Van Dorn molding machine at different mold temperatures with a barrel set temperature of 260° C., 12 s injection time, 14–18 s hold time and 0.7 MPa back pressure.

| Example | B* | 7 |
|---|---|---|
| Polyester[a] | 99.45 | 99.45 |
| Pentaerythritol tetrastearate | 0.2 | 0.2 |
| Phosphite stabilizer | 0.1 | 0.1 |
| Talc | 0.25 | 0.25 |
| Total | 100 | 100 |
| Mold Conditions | | |
| Barrel Temperature (° C.) | 260 | 260 |
| Mold Temperature (° C.) | 66 | 77 |

[a] = Poly(1,4-butylene terephthalate), "VALOX", 5000 poise General Electric Company
* = Comparative Example Results from Examples 1–6

Flame bars were tested for HDT at 0.45 MPa per the ASTM D648 protocol. Metallized plaques were visually inspected for surface appearance. Surfaces without pitting, haze and flow defects were considered acceptable.

| Example | A | 1 | 2 | 3 | 4 | 5 | 6 |
|---|---|---|---|---|---|---|---|
| HDT at 0.45 MPa (° C.) | 137 | 179 | 164 | 182 | 175 | 173 | 175 |
| Surface Appearance | PASS | PASS | PASS | PASS | | | |
| Pits | No | No | No | No | | | |
| Haze | No | No | No | No | | | |
| Flow Defect | No | No | No | No | | | |

Examples 1–3, which contain low levels of talc, titanium dioxide and a mixture of the two nucleants, respectively, clearly show a dramatic increase in heat deflection temperature versus Comparative example A, which does not contain any nucleating agent. Interestingly, the inclusion of talc and/or titanium dioxide does not adversely affect the surface appearance after metallization. Moreover, the nucleants provide a consistent, high heat deflection temperature regardless of the molecular weight of the polyester as indicated by Examples 4–6

EXAMPLE 7

| Example | B | 7 |
|---|---|---|
| HDT at 0.45 MPa (° C.) | 150.9 | 179.6 |

Example 7 and Comparative example B depict the influence of molding conditions on heat deflection temperature. Although both compositions are identical and contain nucleant, surprisingly, the composition molded at the higher mold temperature yields a significantly higher heat deflection temperature.

The above examples clearly show that polyester resins can be used to produce high heat, directly metallizable molded products by admixing low levels of nucleants into the polymer composition and molding the mixture at a suitably high mold temperature.

What is claimed is:

1. A molded resin article consisting essentially of about 80 to about 9.99 weight percent, based on the total weight of the resin composition, of a crystallizable polyester resin derived from aliphatic or cycloaliphatic diols, or mixtures thereof, containing 2 to 10 carbon atoms and at least one aromatic dicarboxylic acid wherein the aromatic group is a $C_6$ to C20 aryl radical, and about 0.1 to 10% by weight of one or more nucleating agents and less than about 5% by weight additional ingredients based on the total weight of the resin composition, and wherein the molded resin article has a heat deflection temperature of at least about 160° C.

2. A molded resin article according to claim 1 wherein said crystallizable polyester resin is present in an amount from about 90 to about 99.9 percent by weight based on the total weight of said resin.

3. A molded resin article according to claim 1, wherein a portion of said article is metallized.

4. A metallized molded resin article according to claim 3 wherein the crystallizable polyester resin is present in an amount greater than 96 percent by weight based on the total weight of said resin.

5. A metallized molded resin article according to claim 4 wherein the nucleating agent is present in an amount from about 0.1 to about 1 percent by weight based on the total weight of the resin component of the article.

6. A metallized molded resin article according to claim 5 wherein the metallization is carried out under a vacuum.

7. A metallized molded resin article according to claim 6 wherein the metallized article comprises aluminum.

8. A metallized molded resin article according to claim 7 wherein the metallized article comprises a reflective vehicle lamp part.

9. A metallized molded resin article according to claim 1 wherein the crystallizable polyester resin component is selected from the group consisting essentially of poly(ethylene terephthalate), poly(1,4-butylene terephthalate), poly(ethylene naphthanoate), poly(butylene naphthanoate), poly(cyclohexanedimethanol terephthalate) and (polypropylene terephthalate) and mixtures thereof.

10. A metallized molded resin article according claim 1 wherein the crystallizable polyester resin component is poly(1,4-butylene terephthalate).

11. A molded resin article according to claim 1, wherein an average particle size of the nucleating agent is in a range from 0.1 micron to 20 microns.

12. A molded resin article according to claim 1, wherein an average particle size of the nucleating agent is in a range from 0.1 micron to 10 microns.

13. A molded resin article according to claim 1, wherein an average particle size of the nucleating agent is in a range from 0.1 micron to 1 micron.

14. A process for making a molded resin article comprising the steps of a) forming a resin mixture consisting essentially from about 80 to about 99.9 weight percent, based on the total weight of the resin composition, of a crystallizable polyester resin derived from aliphatic or cycloaliphatic diols, or mixtures thereof, containing 2 to 10 carbon atoms and at least one aromatic dicarboxylic acid wherein the aromatic group is a $C_6$ to $C_{20}$ aryl radical, and about 0.1 to 10% by weight of one or more nucleating agents and less than about 5% by weight additional ingredients based on the total weight of the resin composition;

b) molding said resin mixture for producing a molded resin article having a heat deflection temperature (HDT) greater than about 160° C.; and optionally c) metallizing a portion of the surface of said article.

* * * * *